United States Patent
Brotzman et al.

(10) Patent No.: US 10,510,985 B2
(45) Date of Patent: Dec. 17, 2019

(54) POLYMER HARD COAT AND METHODS OF PREPARATION

(71) Applicant: Motorola Mobility LLC, Chicago, IL (US)

(72) Inventors: Richard W Brotzman, Naperville, IL (US); Ernest Sirois, Crystal Lake, IL (US); Daniel Thorstenson, Chicago, IL (US)

(73) Assignee: MOTOROLA MOBILITY LLC, Chicago, IL (US)

( * ) Notice: Subject to any disclaimer, the term of this patent is extended or adjusted under 35 U.S.C. 154(b) by 0 days.

(21) Appl. No.: 15/181,722

(22) Filed: Jun. 14, 2016

(65) Prior Publication Data
US 2017/0358771 A1 Dec. 14, 2017

(51) Int. Cl.
*H01L 51/52* (2006.01)
*C08J 7/04* (2006.01)
*C09D 133/04* (2006.01)
*H01L 51/00* (2006.01)
*C08K 3/36* (2006.01)

(52) U.S. Cl.
CPC .......... *H01L 51/5253* (2013.01); *C08J 7/047* (2013.01); *C09D 133/04* (2013.01); *H01L 51/004* (2013.01); *H01L 51/0097* (2013.01); *C08J 2333/12* (2013.01); *C08J 2365/00* (2013.01); *C08J 2367/02* (2013.01); *C08J 2369/00* (2013.01); *C08J 2379/08* (2013.01); *C08J 2433/04* (2013.01); *C08K 3/36* (2013.01); *H01L 2251/303* (2013.01); *H01L 2251/5338* (2013.01)

(58) Field of Classification Search
CPC ... H01B 5/14; H01L 51/5253; H01L 51/0097; H01L 51/004; C09D 133/04; C08J 7/047
See application file for complete search history.

(56) References Cited

U.S. PATENT DOCUMENTS

| | | | | |
|---|---|---|---|---|
| 3,762,940 A | * | 10/1973 | Bechtold | C08L 33/16 427/385.5 |
| 2005/0221095 A1 | * | 10/2005 | Miyazaki | C09D 4/00 428/423.1 |

(Continued)

FOREIGN PATENT DOCUMENTS

EP  1418448  * 5/2004

OTHER PUBLICATIONS

Lubrizol Performance Coatings, "Dispersion Solutions for Paints, Coatings and Graphic Arts", Hyperdispersants Product Guide, www.lubrizol.com/coatings, 2015, 12 pages.

(Continued)

*Primary Examiner* — Matthew L Reames
*Assistant Examiner* — Benjamin T Liu
(74) *Attorney, Agent, or Firm* — Kunzler Bean & Adamson

(57) ABSTRACT

A dispersion comprised of at least 49 wt % of additive particles, a polymerizable monomer, a dispersant and a solvent. Upon polymerization the dispersion forms a hard coat with a haze of at most 0.5% and a transmission of at least 90%. A hard coat comprises at least 49 wt % of additive particles dispersed in a polymer. A method of making a hard coat comprises forming a dispersion, applying the dispersion to one side of a substrate, and polymerizing the dispersion. The hard coat has a haze of at most 0.5% and a transmission of at least 90%.

16 Claims, 2 Drawing Sheets

(56) References Cited

U.S. PATENT DOCUMENTS

| | | | | |
|---|---|---|---|---|
| 2014/0333996 A1* | 11/2014 | Saito | ........................ | B32B 7/02 |
| | | | | 359/359 |
| 2016/0108256 A1* | 4/2016 | Yang | ....................... | C09D 5/24 |
| | | | | 428/220 |
| 2016/0194448 A1* | 7/2016 | Song | .................. | C08G 73/1067 |
| | | | | 428/337 |
| 2016/0369104 A1* | 12/2016 | Gu | ........................... | C09D 4/06 |
| 2017/0022343 A1* | 1/2017 | Sakakibara | .............. | C08J 7/042 |

OTHER PUBLICATIONS

ISO, "Paints and Varnishes—Bend Test (cylindrical mandrel)", Third Edition, Reference No. ISO 1519:2011(E), Jan. 15, 2011, 16 pages.
A.Ya. Malkin, et al., "Experimental Methods of Polymer Physics", 1983, 48 pages.
Lubrizol Performance Coatings, "Solsperse 32000", www.lubrizol.com/coatings, 2012, 2 pages.

\* cited by examiner

POLYMER HARD COAT AND METHODS OF PREPARATION

BACKGROUND

Flexible organic light emitting diodes (OLEDs), such as plastic organic light emitting diodes (pOLEDs), include an electroluminescent organic semiconductor deposited on a flexible substrate. Flexible OLEDs are bendable and lightweight, which allows electronic device manufacturers to explore a variety of designs and configurations that would not be possible with conventional OLEDs deposited on rigid substrates. For example, flexible OLEDs may be incorporated into rollable televisions, flexible lights and foldable mobile electronic devices, such as cellular phones and tablet computers.

The use of plastic in devices that incorporate flexible OLEDs is necessary for lightweight flexible devices; but plastic components are vulnerable to damage and wear. Plastic objects and plastic portions of non-plastic objects are susceptible to physical damage such as scratching, marring, gouging and fracture under mild use conditions. For example, plastic objects may be damaged from interactions with other objects while being carried in a user's pocket or handbag.

Plastics may be protected from damage by applying a protective polymer coating, often referred to as a hard coat. Hard coats may be composed of ultraviolet (UV)-cured acrylates, vinyl ester epoxides, dendritic polymers of polyurethane, dendritic polymers of melamine, or similar polymers and polymer mixtures that form a rigid coating on a substrate. However commercially available hard coats for plastics fail to provide the desired level of protection to flexible plastic articles, such as pOLED displays, due to the processing limitations inherent in applying a coating to a plastic substrate. Hard coats must be applied to plastic articles at low temperatures to prevent damage to the plastic substrates being coated. Low-temperature processing limits the chemistries and processes, which may be employed, which in turn limits the degree of hardness, strength and protective capability of the hard coat. In addition, plastic substrates curl to an increasingly greater extent as films with increasing strain are deposited. Processing conditions during deposition causes strain in the films; these include heat, radiation, and plasma treatment. In general, thicker films and/or harder films (e.g., films with higher oxygen content) cause flexible plastic substrates to curl to a greater extent during processing, for example in a plasma-deposition processes.

Flexible mobile devices that incorporate pOLED displays require hard coats with specific properties in addition to abrasion resistance. Hard coats that are applied to pOLED display stacks must be optically clear and free of optical defects. The frequent use of mobile devices requires highly durable hard coats that maintain their integrity with no permanent plastic deformation for at least 100,000 bending cycles. The construction of pOLED displays, known as pOLED stacks, also imposes requirements on hard coats. The pOLED displays are comprised of multiple layers: pOLED layer, touch layer(s), one or more optical films, and lens layer. The individual layers within a pOLED display can independently be bent to small radii (<5 mm) but once assembled together the stack may break, delaminate, and/or buckle due to tensile and compressive forces arising in the display stack when bent.

SUMMARY

In a first aspect, the invention is a dispersion comprising at least 49 wt % of additive particles, a polymerizable monomer, and a dispersion agent. Upon polymerization the dispersion forms a hard coat with a haze of at most 0.5% and a transmission of at least 90%.

In a second aspect, the invention is a hard coat comprising at least 49 wt % of additive particles dispersed in a polymer. The hard coat has a haze of at most 0.5% and a transmission of at least 90%. The hard coat may be bent to a diameter of at least 10 mm without breaking, buckling or delaminating.

In a third aspect, the invention is a method of making a hard coat comprising forming a dispersion; applying the dispersion to one side of a substrate; and polymerizing the dispersion. The hard coat has a haze of at most 0.5% and a transmission of at least 90%.

Definitions

The term "haze" means the percentage of light that is scattered as it passes through a substance. A low percentage of haze is desirable.

The term "transmission" means the percentage of light that passes through a substance. A high percentage of transmission is desirable.

The term "color" is measured on the L*a*b* colorimetric scale where L* ranges from 0 (black) to 100 (white), a* or a-value is an integer where a positive value represents red and a negative value represents green and b* or b-value is an integer where a positive value represents yellow and a negative value represents blue.

A hard coat is considered to be "optically clear" if it has at most 0.5% haze, at least 90% transmission, and a color in a L*a*b* colorimetric system between −1.0 to 1.0 for b*.

The term "hyperdispersant" means a two-component substance having an anchoring group that attaches or adsorbs to a substance being dispersed and a polymeric chain (also known as a solvent group) that extends from the anchoring group to provide steric stability.

The term "particle size" means the average diameter of the image of the particle as viewed by electron microscopy, unless otherwise stated.

All compositional percentages (%) are weight/weight percentages, unless stated otherwise.

The term "shape memory polymer" (SMP) means a polymer that can be deformed and subsequently fixed into a temporary shape and remains stable unless it is exposed to an appropriate external stimulus that triggers the polymer to recover to its original (or permanent) shape. The associated behavior of a SMP is called polymer "shape memory effect" (SME). Although various forms of external stimuli may be used as the recovery trigger, the most typical one is direct heating that leads to a temperature increase.

The term "self-healing effect" means the recovery of damages (or deformation) typical plastic goods may experience, such as surface damages (e.g. indents or scratches), under the conditions of practical usage. By the mechanism of reverse plastic—SME, the plastic deformation recovers or damages are healed by the application of an external force such as heating or electric-active potential, or the activation of embedded reactive microcapsules. The self-healing mechanism repairs only non-permanent damage such as surface scratches.

BRIEF DESCRIPTION OF THE DRAWINGS

The invention can be better understood with reference to the following drawings and description.

DETAILED DESCRIPTION

The present invention is a hard coat for a flexible plastic substrate formed by polymerizing a dispersion of additive particles, such as sub-micron silica, in a polymerizable monomer, such as an acrylate monomer. Including a high weight percent of the additive particles in the hard coat produces a protective coating that is highly durable, has at most 0.5% haze, at least 90% transmission, may be bent to a diameter of at least 10 mm without breaking, buckling or delaminating and preferably has a color in a L*a*b* colorimetric system between −1.0 to 1.0 for b*. The hard coat preferably increases the tensile modulus of a plastic substrate to at least 4.5 GPa. The hard coat is particularly well suited for application to flexible devices with pOLED displays, such as flexible mobile devices including cellular phones, smart phones and tablet computers.

Figure 1:
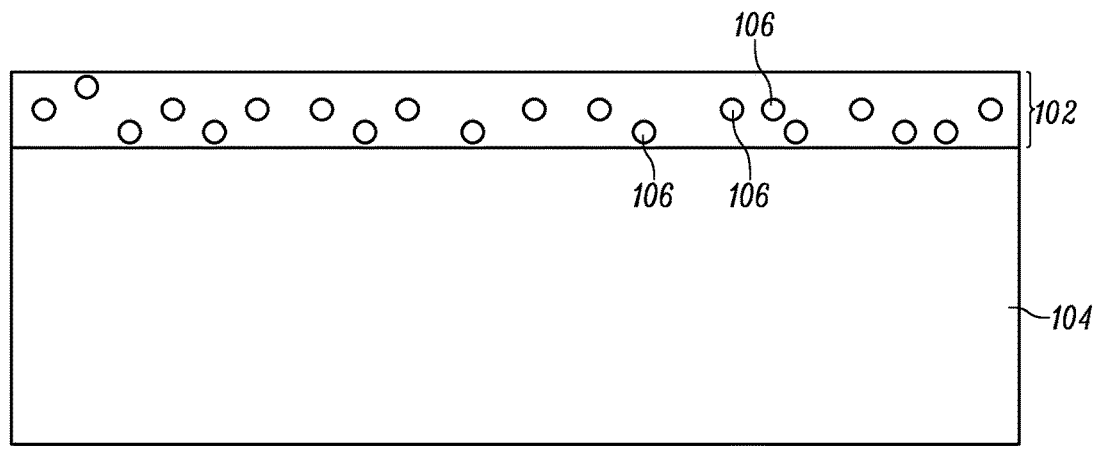
FIG. 1 illustrates a hard coat on a flexible plastic substrate.

FIG. 1 illustrates a hard coat 102 on a flexible plastic substrate 104. Additive particles 106 are dispersed in the hard coat.

The flexible plastic substrate may be a thin polymeric material having a bend diameter of at most 10 mm. Suitable polymeric materials include thin sheet polyethylene terephthalate (PET), cyclic olefin polymer (COP), cyclic olefin copolymer (COC), polycarbonate (PC), polyimide (PI) and poly(methyl methacrylate) (PMMA). Commercially available polymeric materials include PMMA polymer PLEXIGLAS® 8N (Evonik Industries), the impact-modified PMMA polymer PLEXIGLAS® Resist ZK5BR (Evonik Industries), the PC polymer LEXAN™ Resin HFD1810 (SABIC), the COC polymer TOPAS® (Topas Advanced Polymers), and the COP polymer ZEONOR® 1060R (Zeon Corporation).

The flexible plastic substrate may optionally be a suitable polymer sheet laminated with a shape memory polymer (SMP) that demonstrates self-healing which is coated with a hard coat. A SMP may include amine cured aromatic epoxy and cross-linked semi-crystalline polyurethanes, for example.

Preferably, the flexible plastic substrate has a thickness of at most 0.25 mm, for example, 0.002 mm-0.200 mm.

The polymerizable monomer may be any monomer or combination of monomers that when polymerized has a high modulus and provides scratch and abrasion resistance. Suitable polymerizable monomers include acrylates, acrylamides, and combinations of polyisocyanates and polyols. Preferably, the polymerizable monomer is an acrylate monomer.

The additive particles may be a substance, or combination of substances, that increases the desired characteristics of the hard coat, such as hardness, abrasion resistance, durability, or decreased electrical sheet resistance. Preferably, the additive particles are metal, non-metal or metalloid oxides. Suitable additive particles include silicon dioxide ($SiO_2$ or silica), indium tin oxide (ITO), antimony tin oxide (ATO), fluorinated tin oxide (FTO), aluminum oxide ($Al_2O_3$), titanium dioxide ($TiO_2$) and zinc oxide (ZnO). An especially preferred additive particle is silica, such as fumed silica sold under the AEROSIL® trademark (Evonik Industries). The additive particles may impart additional functional characteristics to the hard coat in addition to protecting the plastic substrate. For example, ITO, ATO or ZnO may impart a level of conductivity to the hard coat.

The additive particles may optionally be chemically treated. For example, a surface treatment may impart additional characteristics such as increased chemical resistance. Suitable examples of chemically treated additive particles include surface-treated silica sold under the ACEMATT® trademark (Evonik Industries), including ACEMATT® 3600.

The particle size of the additive particles must be small enough so that they do not affect the optical clarity of the hard coat or induce optical defects that scatter light. Preferably, the additive particles or particle aggregates are submicron sized or smaller (have a diameter less than 1 μm or 1,000 nm). More preferably, the additive particles or particle aggregates have a diameter of at most 250 nm. Examples include additive particles with a diameter of 10-200 nm.

The additive particles may be dispersed in the polymerizable monomer or monomer mixture to form a hard coat dispersion. The dispersion may preferably contain at least 49 wt % of additive particles, including at least 50 wt %, at least 51 wt %, at least 52 wt %, at least 53 wt %, at least 54 wt %, at least 55 wt %, at least 56 wt %, at least 57 wt %, at least 58 wt %, at least 59 wt %, at least 60 wt %, at least 61 wt %, at least 62 wt %, at least 63 wt %, at least 64 wt % and at least 65 wt % additive particles. The dispersion may preferably contain 49 to 65 wt % additive particles, 56 to 64 wt % additive particles, or 56 to 60 wt % additive particles, including 50 wt %, 51 wt %, 52 wt %, 53 wt %, 54 wt %, 55 wt %, 56 wt %, 57 wt %, 58 wt %, 59 wt %, 60 wt %, 61 wt %, 62 wt %, 63 wt % and 64 wt % additive particles.

A hard coat dispersion of the additive particles in the polymerizable monomer may be formed according to the following processes. The additive particles are wet and dispersed in a solvent by adding with stirring and sonication and added to a polymerizable monomer or monomer mixture by stirring and sonication to form the hard coat dispersion. Preferably, the solvent is a complexing solvent, such as an alcohol, ether, aldehyde or ketone; examples of suitable complexing solvents include ethoxyethanol, butoxyethanol and cyclohexanone. Optionally, the solvent may be removed before polymerization. Alternatively, the additive particles are wet and dispersed in a polymerizable monomer or monomer mixture by adding with stirring and sonication to form the hard coat dispersion. During mixing the sonicator probe is immersed in the stirred dispersion until the liquid level covers ½ inch of the probe. While maintaining rapid stirring, the dispersion is sonicated at about 2.5 kW-minute/kg of additive using a Watt Meter to measure the power. The dispersion may be filtered through a 400-mesh sieve. The loss on ignition (LOI) of the filtered dispersion is measured. The concentration of the dispersion may then be adjusted to achieve a desired concentration.

The dispersion may optionally include a dispersing agent (dispersant). The dispersing agent may be chosen to achieve a desired loading of additive particles in the dispersion. The dispersion may preferably contain 0.1-50 wt % dispersing agent with respect to the amount of additive particles, more preferably 1-20 wt % dispersing agent with respect to the amount of additive particles, including 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt % and 19 wt % dispersing agent with respect to the amount of additive particles. Preferably, the dispersing agent is a hyperdispersant. Suitable dispersants include hyperdispersants sold under the SOLSPERSE® trademark (The Lubrizol Corporation), such as SOLSPERSE® 3000, SOLSPERSE® 5000s, SOLSPERSE® 8000, SOLSPERSE® 9000, SOLSPERSE® 11200, SOLSPERSE® 12000s, SOLSPERSE® 13300, SOLSPERSE® 13400, SOLSPERSE® 13500, SOLSPERSE® 13650, SOLSPERSE® 13940, SOLSPERSE® 16000, SOLSPERSE® 17000, SOLSPERSE® 17940, SOLSPERSE® 18000, SOLSPERSE® 19000, SOLSPERSE® 20000, SOLSPERSE® 21000, SOLSPERSE® 22000, SOLSPERSE® 24000SC, SOLSPERSE® 26000, SOLSPERSE® 27000, SOLSPERSE® 28000, SOLSPERSE® 32000, SOLSPERSE® 32500, SOLSPERSE® 32600, SOLSPERSE® 33000, SOLSPERSE® 35000, SOLSPERSE® 35100, SOLSPERSE® 36000, SOLSPERSE® 36600, SOLSPERSE® 37500, SOLSPERSE® 38500, SOLSPERSE® 39000, SOLSPERSE® 40000, SOLSPERSE® 41000, SOLSPERSE® 41090, SOLSPERSE® 43000, SOLSPERSE® 44000, SOLSPERSE® 45000, SOLSPERSE® 46000, SOLSPERSE® 47000, SOLSPERSE® 53095, SOLSPERSE® 55000, SOLSPERSE® 64000, SOLSPERSE® 65000, SOLSPERSE® 66000, SOLSPERSE® 71000, SOLSPERSE® 73000, SOLSPERSE® 76400, SOLSPERSE® 76500, SOLSPERSE® 79000, SOLSPERSE® 81500, SOLSPERSE® 82500, SOLSPERSE® 83500, SOLSPERSE® 88000, SOLSPERSE® M385, SOLSPERSE® M386, SOLSPERSE® M387, SOLSPERSE® M388, SOLSPERSE® M389, SOLSPERSE® V320, SOLSPERSE® V350, SOLSPERSE® V360, SOLSPERSE® WV400, SOLSPERSE® X300 and mixtures thereof.

A hard coat dispersion of the additive particles in the polymerizable monomer that includes a dispersing agent may be formed according to the following processes. The additive particles are wet and dispersed in a solvent by adding with stirring and sonication and subsequently added to a polymerizable monomer or monomer mixture by stirring and sonication to form the hard coat dispersion. Preferably, the solvent is a complexing solvent, such as an alcohol, ether, aldehyde or ketone; examples of suitable complexing solvents include ethoxyethanol, butoxyethanol and cyclohexanone. Optionally, the solvent may be removed before polymerization. Alternatively, the additive particles are wet and dispersed in a polymerizable monomer or monomer mixture by adding with stirring and sonication to form the hard coat dispersion. During mixing the sonicator probe is immersed in the stirred dispersion until the liquid level covers ½ inch of the probe. While maintaining rapid stirring, the dispersion is sonicated at about 2.5 kW-minute/kg of additive using a Watt Meter to measure the power. The dispersion may be filtered through a 400-mesh sieve. The loss on ignition (LOI) of the filtered dispersion is measured. The concentration of the dispersion may then be adjusted to achieve a desired concentration.

The hard coat formulation may be applied to the flexible plastic substrate by conventional coating techniques. For example, the dispersion may be applied using slot die, cascade, or curtain coating techniques. The dispersion may be applied to one side, or to both sides of the flexible plastic substrate. A flexible plastic substrate coated on both sides may have the same dispersion applied to each side, or may have different dispersions applied to each side. For example, one side of the flexible plastic substrate may be coated with 65 wt % silica dispersed in acrylate while the opposite side is coated with 35 wt % silica dispersed in acrylate.

The hard coat may be formed on the flexible plastic substrate by applying sufficient energy to polymerize the monomer. For example, the polymerizable monomer may be polymerized by applying heat (thermal activation) or radiation, such as UV radiation, gamma radiation, or beta radiation (electron beam processing).

The hard coat may have a thickness of 0.1 to 50 μm, preferably 0.5 to 10 μm, including 1.0 μm, 1.5 μm, 2.0 μm, 2.5 μm, 3.0 μm, 3.5 μm, 4.0 μm, 4.5 μm, 5.0 μm, 5.5 μm, 6.0 μm, 6.5 μm, 7.0 μm, 7.5 μm, 8.0 μm, 8.5 μm, 9.0 μm and 9.5 μm. The thickness of the hard coat may be varied based on the intended use of the flexible plastic substrate.

The clarity of the hard coat may be determined by measuring its haze (reported as a percentage), transmission (reported as a percentage) and/or color (reported according to the L*a*b* colorimetric scale). Haze and transmission may be measured with a transparency meter and/or a haze meter. The hard coat preferably has a haze of at most 0.5%, more preferably a haze of at most 0.2%. The hard coat preferably has a transmission of at least 90%, more preferably a transmission of at least 94%. Color may be measured with a color measurement instrument, such as a spectrophotometer. The hard coat preferably has a color in a L*a*b* colorimetric system between −1.0 to 1.0 for b*. Preferably, the hard coat is optically clear.

The clarity of the hard coat may be measured after abrasion to evaluate the amount of protection imparted by the hard coat. Abrasion resistance may be measured by abrading the hard coat with silicon carbide (SiC) using a Taber linear abraser. The hard coat may have a haze of at most 20% after abrasion, preferably a haze of at most 15% after abrasion, more preferably a haze of at most 10% after abrasion, even more preferably a haze of at most 5% after abrasion.

Additional functional coatings may be applied with the hard coat to the flexible plastic substrate. For example, the flexible plastic substrate may also be coated with an anti-reflective coating, a conductive coating, or a self-healing SMP coating. Any additional functional coatings must not impair the hardness, optical clarity, durability or flexibility imparted by the hard coat.

Figure 2:
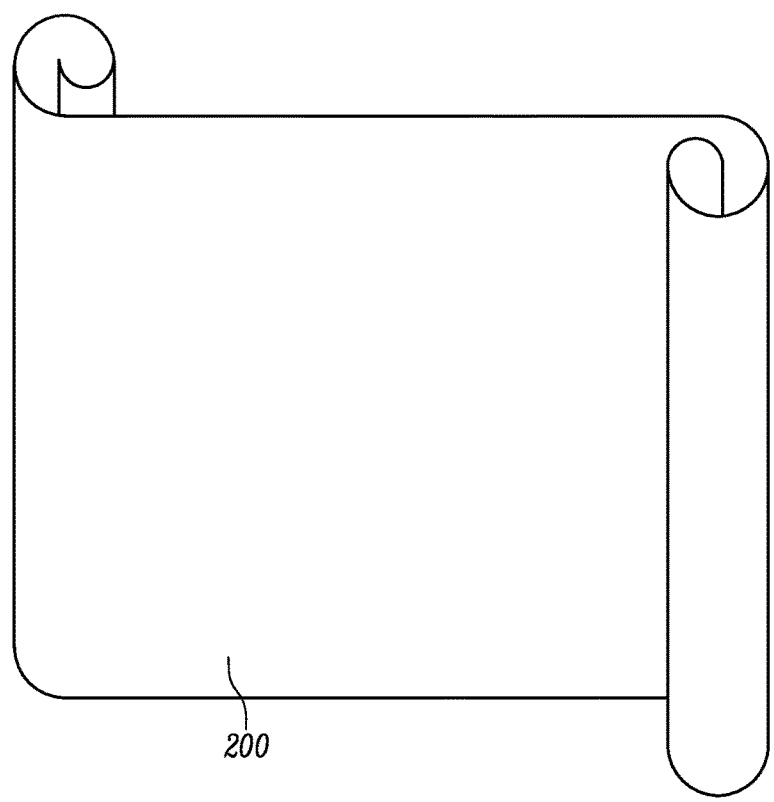
FIG. 2 illustrates a rollable monitor with a pOLED display that has been coated with a hard coat.
Figure 3:
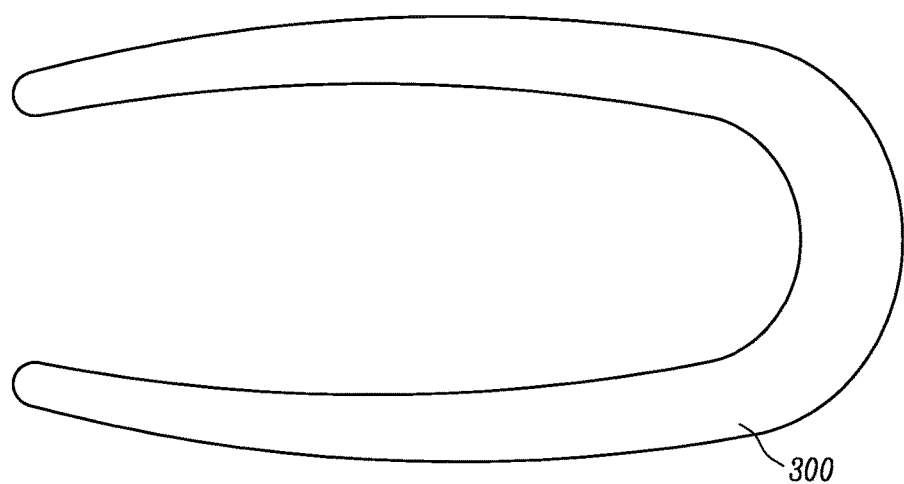
FIG. 3 illustrates a foldable smart phone with a pOLED display that has been coated with a hard coat.

The hard coat may be applied to a flexible device that includes plastic portions, such as a pOLED display. FIG. 2 illustrates a rollable monitor 200 with a pOLED display that has been coated with a hard coat. FIG. 3 illustrates a foldable smart phone 300 with a pOLED display that has been coated with a hard coat.

EXAMPLES

Example 1—Abrasion Resistance

The abrasion resistance of commercially available polymeric materials was measured before and after application of a 3 μm thick hard coat of submicron sized silica dispersed in an acrylate resin. Abrasion resistance was measured using the SiC abrasion test. In the SiC abrasion test, a substance is placed in a TABER® 5700 Linear Abraser (North Tonawanda, N.Y.) and 800-grit silicon carbide (SiC) sand paper (1 inch diameter, about 0.8 in$^2$ area) under a 350 g vertical load is applied to the substance for 100 cycles (1 cycle=2 strokes) of 1 inch in length measured center-to-center (2 inches total linear length) at a rate of 60 cycles/min (1 cycle/second).

Transmitted haze was measured using a BYK Gardner Haze-Gard Plus transparency meter. The % haze indicated the degree of abrasion, with a low % haze being desirable.

Abrasion resistance was determined according to the following procedure. First, both surfaces of the specimen were wiped with a dry low-lint cleanroom wipe to remove any debris. Next, the % haze and % transmission were measured. The specimen was then inspected for small cracks and/or asperities and for any debris before being tightly secured to the flat surface of the linear abraser tool. The SiC abrasion test was performed. After the SiC abrasion test was completed, both sides of the specimen were wiped with a dry low-lint cleanroom wipe to remove any debris. The % haze of the abraded area was then measured.

Table 1 shows the abrasion resistance of commercially available polymeric materials with an acrylate hard coat without additive particles.

TABLE 1

Abrasion resistance (acrylate hard coat without additive particles)

| | Polymer substrate | | | | |
|---|---|---|---|---|---|
| PMMA | PMMA (impact modified) | PC | COC | COP | PET |
| Abrasion resistance 24% | 24% | 24% | 24% | 24% | 24% |

Table 2 shows the abrasion resistance of polymeric materials with a 3 μm thick hard coat comprised of sub-micron sized silica dispersed in an acrylate matrix (amount of sub-micron silica in hard coat is indicated).

TABLE 2

Abrasion resistance (acrylate hard coat with silica)

| | Polymer substrate | | | | |
|---|---|---|---|---|---|
| | PMMA/PC (0.25 mm) | PMMA/PC (0.25 mm) | PC (0.2 mm) | PET (0.05 mm) | PET (0.05 mm) | PET (0.05 mm) |
| Silica in hard coat | 48.3 wt % | 54.5 wt % | 45 wt % | 50 wt % | 57.8 wt % | 65.0 wt % |
| Abrasion resistance | 5.6% | 4.3% | 11.9% | 6.8% | 2.5% | 2.6% |

The inclusion of silica additive particles in the hard coat significantly improved the abrasion resistance for the polymers.

Example 2—Dynamic Mechanical Analysis of Polymeric Materials with Hard Coat

Dynamic mechanical analysis (DMA) and uniaxial tension techniques were used to quantify the viscoelastic behavior of thin polymeric materials coated with a hard coat of 50 wt % silica dispersed in acrylate. DMA applies a sinusoidal strain to a clamped sample and the stress is measured, allowing determination of the complex modulus. Sample temperature at a set strain frequency may be varied to quantify the glass transition temperature. A detailed discussion of DMA may be found in Malkin, A. Y. et al., "Experimental Methods of Polymer Physics", Part 3, pp. 162-255, (Prentice-Hall, Inc., 1983).

PET (0.05 mm), PET (0.1 mm), PC (0.125 mm) and PMMA/PC (0.2 mm) substrates were coated with a hard coat and analyzed by DMA. One side of the polymer was coated with a 3 μm thick hard coat of 50 wt % silica dispersed in acrylate and the other side was coated with a 3 μm thick hard coat of acrylate. Table 3 shows the storage modulus (E'), glass transition temperature ($T_g$) and tan δ (peak) for each polymeric material.

TABLE 3

DMA of polymeric materials with hard coat

| | PET (0.05 mm) | PET (0.1 mm) | PC (0.125 mm) | PMMA/PC (0.2 mm) |
|---|---|---|---|---|
| Storage Modulus (GPa) | 4.7 | 4.4 | 1.8 | 2.1 |
| $T_g$ (C) | 113 | 106 | 148 | 144 |
| Tan δ (peak) (abs) | 0.14 | 0.15 | 0.50 | 0.52 |

The PET polymeric materials had a higher storage modulus than the PC or PMMA/PC polymeric materials, indicating greater elastic behavior. The modulus of the 3 μm thick hard coat of 50 wt % silica dispersed in acrylate (without any substrate) is estimated to be approximately 15 GPa.

Example 3—Mandrel Bend Test

A mandrel bend test as set forth in ISO 1519 Paints and varnishes—Bend test (cylindrical mandrel) was performed on PET substrates with a thickness of 0.05 mm, 0.075 mm or 0.1 mm coated with an acrylate polymer. Varying amounts of silica were included in the acrylate polymer. The PET films were coated on one or both sides. Two of the 0.075 mm thick films had an anti-smudge coating. Table 4 shows the results of the mandrel bend test. Any cells marked "N/A" indicate that the given parameter was not measured.

TABLE 4

PET mandrel bend test - Silica content in the hard coat on each surface is given

| PET thickness (mm) | SiO₂ wt % (front/back) | Average mandrel bend diameter (mm) | Range of mandrel bend diameter (mm) | Hard coat thickness (μm) |
|---|---|---|---|---|
| 0.05 | 0/0 | <2.7 | N/A | N/A |
| 0.05 | 50.0/0 | 2.7 | 0 | 3 |
| 0.05 | 57.8/35.3 | 3.4 | 0.7 | 3 |
| 0.05 | 56.1/57.6 | 4.3 | 1.0 | N/A |
| 0.05 | 65.0/35.7 | 3.0 | 1.3 | 3 |
| 0.05 | 64.1/66.5 | 4.3 | 1.2 | 3 |
| 0.075 (anti-smudge) | 0/0 | 5-7 | N/A | 8 |
| 0.075 | 58.5/36.9 | 4.7 | 2.2 | 3 |
| 0.075 (anti-smudge) | 56/0 | 7.0 | 0.6 | 3 |
| 0.075 | 58.4/57.8 | 6.7 | 1.0 | N/A |
| 0.075 | 65.2/34.5 | 8.5 | 2.1 | 3 |
| 0.075 | 64.4/65.6 | 7.4 | 1.5 | 3 |

TABLE 4-continued

PET mandrel bend test - Silica content in the hard coat on each surface is given

| PET thickness (mm) | SiO$_2$ wt % (front/back) | Average mandrel bend diameter (mm) | Range of mandrel bend diameter (mm) | Hard coat thickness (μm) |
|---|---|---|---|---|
| 0.1 | 47.4/0 | 7.6 | 0 | 2.4 |
| 0.1 | 58.2/0 | 10.5 | 0.9 | 3 |

A mandrel bend test was also performed on PC/PMMA substrates coated with an acrylate polymer. Varying amounts of silica were included in the acrylate polymer. Table 5 shows the results of the mandrel bend test.

TABLE 5

PC/PMMA mandrel bend test - Silica content in the hard coat on each surface is given

| PMMA/PC thickness (mm) | SiO$_2$ wt % | Average mandrel bend diameter (mm) | Range of mandrel bend diameter (mm) | Hard coat thickness (μm) |
|---|---|---|---|---|
| 0.2 | 45.8/0 | 16.2 | 0.4 | 3 |
| 0.25 | 0/0 | 12.4 | 0.6 | 3 |
| 0.25 | 45/0 | 17.4 | 0.9 | 3.0 |
| 0.25 | 49/0 | 19.7 | 0.7 | 2.9 |
| 0.25 | 56/0 | 22.3 | 0.9 | 3.2 |

Example 4—Abrasion Resistance of PET, PC and PC/PMMA with Hard Coat

An abrasion resistance test as described previously was performed on PET, PC and PC/PMMA substrates coated with an acrylate polymer. Varying amounts of silica were included in the acrylate polymer. The results of the abrasion resistance test are shown in Table 6. Any cells marked "N/A" indicate that the given parameter was not measured.

TABLE 6

Abrasion resistance test of polymers with hard coat - Silica content in the hard coat on each surface is given

| Substrate (total thickness, mm) | SiO$_2$ wt % (front/back) | Average SiC haze | Range of SiC haze |
|---|---|---|---|
| PET (0.05) | 0/0 | 40.9 | 7.4 |
| PET (0.05) | 49.6/0 | 6.78 | 1.10 |
| PET (0.05) | 57.8/35.3 | 2.49 | 0.40 |
| PET (0.05) | 56.1/57.6 | 4.38 | 0.66 |
| PET (0.05) | 65.0/35.7 | 2.58 | 0.24 |
| PET (0.05) | 64.1/66.5 | 3.03 | 0.45 |
| PET (0.075) anti-smudge | 0/0 | 22.8 | 8.8 |
| PET (0.075) | 58.5/36.9 | 3.05 | 1.01 |
| PET (0.075) anti-smudge | 56/0 | 6.59 | 1.22 |
| PET (0.075) | 58.4/57.8 | 3.43 | 0.47 |
| PET (0.075) | 65.2/34.5 | 3.31 | 0.18 |
| PET (0.075) | 64.4/65.6 | 2.73 | 0.11 |
| PET (0.1) | 47.4/0 | 7.21 | 0.83 |
| PET (0.1) | 58.2/0 | 4.43 | 0.60 |
| PC (0.125) | 45.0/0 | 11.87 | 0.87 |
| PC (0.4) | 0/0 | 26.9 | 6.1 |
| PMMA/PC (0.2) | 45.8/0 | 6.93 | 0.73 |
| PMMA/PC (0.25) | 0/0 | 24.06 | 6.83 |
| PMMA/PC (0.25) | 10/0 | 15.21 | 3.82 |
| PMMA/PC (0.25) | 20/0 | 9.41 | 1.68 |
| PMMA/PC (0.25) | 30/0 | 6.11 | 1.60 |
| PMMA/PC (0.25) | 45/0 | 5.72 | 2.52 |
| PMMA/PC (0.25) | 49/0 | 5.59 | 2.08 |
| PMMA/PC (0.25) | 55/0 | 4.27 | 1.61 |

Example 5—DMA of PET Substrate with Acrylate Hard Coat

PET substrates were coated with an acrylate hard coat and analyzed by DMA. Varying amounts of silica were included in the acrylate polymer. DMA tests were carried out at a fixed temperature (30° C.) and variable frequency (0.1-50 Hz, 3 pts/decade), and at a fixed frequency (1 Hz) and variable temperature (room temperature-150° C., 0° C./min). The results are shown in Table 7 and Table 8, respectively.

TABLE 7

Fixed temperature DMA tests - Silica content in the hard coat on each surface is given

| PET thickness (mm) | SiO$_2$ wt % (front/back) | Storage modulus (GPa) | Standard deviation of storage modulus (GPa) |
|---|---|---|---|
| 0.05 | 49.6/0 | 5.63 | 0.04 |
| 0.05 | 56.1/0 | 5.81 | 0.09 |
| 0.05 | 65.0/35.0 | 5.93 | 0.04 |
| 0.05 | 63.5/63.2 | 6.21 | 0.25 |

TABLE 8

Fixed frequency at 1 Hz, DMA tests - Silica content in the hard coat on each surface is given

| PET thickness (mm) | SiO$_2$ wt % (front/back) | Storage modulus (GPa) | Standard deviation of storage modulus (GPa) | $T_g$ (C.) | Standard deviation of $T_g$ (C.) |
|---|---|---|---|---|---|
| 0.05 | 49.6/0 | 4.73 | 0.68 | 112.98 | 7.81 |
| 0.05 | 65.0/35.0 | 4.69 | 0.54 | 119.15 | 1.05 |
| 0.05 | 63.5/63.2 | 5.37 | 0.30 | 118.46 | 0.97 |
| 0.075 | 65.2/34.5 | 6.06 | 0.02 | 120.18 | 0.37 |
| 0.075 | 63.5/63.4 | 6.04 | 0.15 | 120.47 | 0.37 |
| 0.1 | 47.4/0 | 4.41 | 0.07 | 106.13 | 1.55 |

A single tension test to 18 N at 30° C. was performed. The results of the single tension test are shown in Table 9.

TABLE 9

Single tension test

| PET thickness (mm) | SiO$_2$ wt % (front/back) | Storage modulus (GPa) | Standard deviation of storage modulus (GPa) |
|---|---|---|---|
| 0.05 | 49.6/0 | 4.2 | 0.8 |
| 0.05 | 65.0/35.0 | 4.6 | 0.1 |
| 0.05 | 63.5/63.2 | 5.2 | 0.5 |
| 0.1 | 0/0 | 4.0 | 0.1 |
| 0.1 | 49/0 | 3.4 | 0.2 |

The results indicate that for PET substrates with an acrylate hard coat, the modulus decreases with increasing PET thickness and increases with silica content.

Example 6—Optical Analysis of PET Substrate with Acrylate Hard Coat

The transmission and haze of PET substrates with a thickness of 0.05 mm or 0.075 mm coated with an acrylate polymer were measured using a BYK Gardner Haze-Gard Plus transparency meter. Varying amounts of silica were included in the acrylate polymer. The PET films were coated on both sides. Table 10 shows the results of the optical analysis.

TABLE 10

Transmission and haze of PET substrate with hard coat - silica content in the hard coat on each surface is given

| PET thickness (mm) | $SiO_2$ wt % (front/back) | Transmission | Haze |
|---|---|---|---|
| 0.05 | 49.6/0.09 | 93.6% | 0.20% |
| 0.05 | 57.8/35.3 | 94.2% | 0.14% |
| 0.05 | 56.1/57.6 | 94.2% | 0.17% |
| 0.05 | 65/35.7 | 94.2% | 0.15% |
| 0.05 | 64.1/66.5 | 94.6% | 0.13% |
| 0.075 | 58.5/36.9 | 94.0% | 0.17% |
| 0.075 | 58.4/57.8 | 94.2% | 0.16% |
| 0.075 | 65.2/34.5 | 94.2% | 0.15% |
| 0.075 | 64.4/65.6 | 94.6% | 0.13% |

The results indicate that all hard coats had a transmission of at least 90% and a haze of at most 0.2%.

REFERENCES

1. Xie, T. et al., "Facile tailoring of thermal transition temperatures of epoxy shape memory polymers", Polymer, vol. 50, pp. 1852-1856 (2009).
2. Xie, T., "Recent advances in polymer shape memory", Polymer, vol. 52, pp. 4985-5000 (2011).
3. "ISO 1519 Paints and varnishes—Bend test (cylindrical mandrel)", International Organization for Standardization (Jan. 15, 2011).
4. "Hyperdispersants product guide", The Lubrizol Corporation (2015).
5. "SOLSPERSE™ 32000 Technical data sheet" The Lubrizol Corporation (2012).
6. Malkin, A. Y. et al., "Experimental Methods of Polymer Physics", Part 3, pp. 162-255, (Prentice-Hall, Inc., 1983).
7. "CIE L*a*b* Color Scale", Applications Note, Vol. 8, No. 7 (Jul. 1-15, 1996).

What is claimed is:

1. A hard coat, comprising:
additive particles dispersed in a polymer, wherein the additive particles are silicon dioxide, the hard coat is formed from a dispersion applied to a front side of a polyimide (PI) substrate with a thickness of 0.05 millimeters (mm) and 57.8 wt % silicon dioxide, the dispersion is applied to a back side of the PI substrate with 35.3 wt % silicon dioxide, the hard coat has a haze of at most 0.5% and a transmission of at least 90%, wherein the dispersion comprises a polymerizable monomer, a dispersant, and a solvent, and
the hard coat may be bent to a diameter of at least 10 mm without breaking, bucking or delaminating.

2. The hard coat of claim 1, wherein
the polymerizable monomer is selected from the group consisting of acrylates and acrylamides, and
upon polymerization, the hard coat has a color in a L*a*b* colorimetric system between −1.0 to 1.0 for b*.

3. The hard coat of claim 2, wherein the dispersion comprises 49-65 wt % of additive particles.

4. The hard coat of claim 2, wherein the dispersant is a hyperdispersant.

5. The hard coat of claim 2, wherein the additive particles have a diameter of at most 250 nm.

6. The hard coat of claim 2, wherein the solvent is a complexing solvent.

7. The hard coat of claim 2, wherein the polymerizable monomer is an acrylate monomer, and the dispersant is a hyperdispersant.

8. A method comprising:
forming the hard coat of claim 1.

9. The method of claim 8, wherein the hard coat has a color in a L*a*b* colorimetric system between −1.0 to 1.0 for b*.

10. The method of claim 9, wherein the dispersion further comprises a hyperdispersant.

11. The method of claim 9, wherein the applying the dispersion comprises applying the dispersion to both sides of the PI substrate.

12. A hard coat, comprising additive particles dispersed in a polymer,
wherein the additive particles are silicon dioxide, the hard coat is formed from a dispersion applied to a front side of a polyimide (PI) substrate with a thickness of 0.05 millimeters (mm) and 57.8 wt % silicon dioxide, the dispersion is applied to a back side of the PI substrate with 35.3 wt % silicon dioxide, the hard coat has a haze of at most 0.5% and a transmission of at least 90%, and
the hard coat may be bent to a diameter of at least 10 mm without breaking, bucking or delaminating.

13. The hard coat of claim 12, wherein
the polymer is selected from the group consisting of acrylate polymers and acrylamide polymers, and
the hard coat has a color in a L*a*b* colorimetric system between −1.0 to 1.0 for b*.

14. The hard coat of claim 13, wherein the hard coat increases the tensile modulus of a plastic substrate to at least 4.5 GPa.

15. The hard coat of claim 13, wherein the hard coat has a haze of at most 20% after silicon carbide (SiC) abrasion.

16. A flexible device comprising a plastic organic light emitting diode (pOLED) display, wherein the pOLED has been coated with the hard coat of claim 12.

* * * * *